(12) United States Patent
Newell et al.

(10) Patent No.: US 12,533,956 B2
(45) Date of Patent: Jan. 27, 2026

(54) ADVANCED SHUTDOWN DURING FAULT-CURRENT CONDITIONS FOR SEMICONDUCTOR DEVICES

(71) Applicant: Caterpillar Inc., Peoria, IL (US)

(72) Inventors: Zachary W. Newell, Edwards, IL (US); Venkata Ramakrishna Challa, Narasaraopet (IN)

(73) Assignee: Caterpillar Inc., Peoria, IL (US)

( * ) Notice: Subject to any disclaimer, the term of this patent is extended or adjusted under 35 U.S.C. 154(b) by 0 days.

(21) Appl. No.: 18/735,315

(22) Filed: Jun. 6, 2024

(65) Prior Publication Data

US 2025/0376032 A1    Dec. 11, 2025

(51) Int. Cl.
*B60L 3/00* (2019.01)
*H02H 7/08* (2006.01)
(Continued)

(52) U.S. Cl.
CPC ........... *B60L 3/003* (2013.01); *H02H 7/0844* (2013.01); *H02H 9/001* (2013.01); *H02P 27/06* (2013.01); *H02P 29/024* (2013.01); *H02P 29/0241* (2016.02); *H03K 17/08128* (2013.01); *H03K 17/0828* (2013.01); *H03K 17/163* (2013.01);
(Continued)

(58) Field of Classification Search
CPC .... H02P 27/06; H02P 29/0241; H02P 29/024; H02M 1/08; H02M 1/32; H02M 7/5387; H02M 1/0029; H02M 1/0006; H03K 17/163; H03K 17/08128; H03K 17/0828; H03K 17/168; H03K 17/08122; H03K 17/166; H03K 17/18; H03K 2217/0027; H03K 17/08; H03K 17/081;
(Continued)

(56) References Cited

U.S. PATENT DOCUMENTS 5,596,466 A * 1/1997 Ochi .................... H02M 7/5387
361/103
6,335,608 B1    1/2002 Takahashi
(Continued)

FOREIGN PATENT DOCUMENTS

CN    109698611    4/2019
CN    215267620    12/2021
(Continued)

*Primary Examiner* — Ryan Johnson
(74) *Attorney, Agent, or Firm* — Schwegman, Lundberg & Woessner (57) ABSTRACT

A drive circuit includes power devices that provide current to a load. At least a portion of the power devices are disposed in a first voltage domain of the drive circuit; a controller circuit configured to provide control signals to activate and deactivate the power devices, wherein the controller circuit is disposed in a second voltage domain separated from the first voltage domain by a first voltage isolation barrier; a smart gate driver configured to transfer a control signal from the second voltage domain to another voltage domain; and an over-current detection circuit disposed in the first voltage domain and configured to produce a fault signal when detecting a current fault condition of the power devices and send the fault signal as a soft-shutdown signal to the smart gate driver. The smart gate driver performs a soft-shutdown of the power devices in response to the soft-shutdown signal.

20 Claims, 4 Drawing Sheets

(51) Int. Cl.
   *H02H 9/00* (2006.01)
   *H02P 27/06* (2006.01)
   *H02P 29/024* (2016.01)
   *H03K 17/0812* (2006.01)
   *H03K 17/082* (2006.01)
   *H03K 17/16* (2006.01)

(52) U.S. Cl.
   CPC .. *B60L 2200/40* (2013.01); *H03K 2217/0027* (2013.01)

(58) Field of Classification Search
   CPC ........... H03K 17/08116; H03K 17/689; H02H 7/0822; H02H 9/001; H02K 11/20
   See application file for complete search history.

(56) References Cited

U.S. PATENT DOCUMENTS

| | | |
|---|---|---|
| 10,224,920 B2 | 3/2019 | Volke et al. |
| 10,917,081 B1 * | 2/2021 | Nguyen ................. H03K 17/18 |
| 2004/0120090 A1 | 6/2004 | Galli et al. |
| 2015/0085403 A1 * | 3/2015 | Santos ................... H02K 11/20 361/33 |
| 2018/0337667 A1 * | 11/2018 | Jaksic ................ H03K 17/0828 |
| 2022/0190818 A1 | 6/2022 | Heckroth et al. |

FOREIGN PATENT DOCUMENTS

| | | |
|---|---|---|
| CN | 114640086 | 6/2022 |
| CN | 219394408 | 7/2023 |

* cited by examiner

ADVANCED SHUTDOWN DURING FAULT-CURRENT CONDITIONS FOR SEMICONDUCTOR DEVICES

TECHNICAL FIELD

This document relates to high voltage and current drive circuits for electric motors and in particular to managing overcurrent conditions in such circuits.

BACKGROUND

Powering a large moving non-road work machine (e.g., a wheel loader, a mining truck, etc.) with an electric motor requires a large mobile electric energy source that can provide current of tens to hundreds of Amperes (Amps). Direct current (DC) energy from the energy source is converted to alternating current (AC) energy using power devices (e.g., power field effect transistors) to power the electric motor. An overcurrent condition from a failure in the electric motor or of one or more power devices in a drive circuit for an electric motor can lead to damage other equipment of the work machine. Chinese Patent No. CN219394408U relates to an overcurrent protection circuit and power equipment.

SUMMARY OF THE INVENTION

Electric powered large moving work machines use large capacity battery systems that provide energy to electric motors of the work machines. Electrical circuits for the work machines include high power converter circuits that convert the DC energy from the energy source to AC energy to power the electric motors of a work machine. In the event of failure of a high power converter circuit, it is desired to minimize damage to equipment of the work machine.

An example of a drive circuit for an electric motor or generator includes power devices configured to provide current to a load of the drive circuit, wherein at least a portion of the power devices are disposed in a first voltage domain of the drive circuit; a controller circuit configured to provide control signals to activate and deactivate the power devices, wherein the controller circuit is disposed in a second voltage domain separated from the first voltage domain by a first voltage isolation barrier; at least one smart gate driver circuit configured to transfer a control signal from the second voltage domain to another voltage domain; an over-current detection circuit disposed in the first voltage domain and configured to produce a fault signal when detecting a current fault condition of the power devices and send the fault signal as a soft-shutdown signal to the at least one smart gate driver circuit; and wherein the at least one smart gate driver circuit is configured to perform a soft-shutdown of the power devices in response to the soft-shutdown signal.

An example method of operating a drive circuit for an electric motor or generator includes providing current to a load of the drive circuit using one or more power devices that are disposed in a first voltage domain of the drive circuit; providing a control signal to the one or more power devices in the first voltage domain using a controller circuit disposed in a second voltage domain of the drive circuit, wherein the control signal traverses a first voltage isolation barrier arranged between the first and second voltage domain using a smart gate drive circuit; detecting a current fault condition in at least one of the power devices using a current fault detection circuit disposed in the first voltage domain and producing a fault signal; sending the fault signal from the first voltage domain to the controller circuit disposed in the second voltage domain and providing the fault signal to the smart gate drive circuit as a soft-shutdown signal; and deactivating the one or more power devices according to a soft shutdown in response to the soft-shutdown signal.

DETAILED DESCRIPTION

Examples according to this disclosure are directed to methods and devices that improve efficiency of the electric motors of a work machine.

Figure 1:
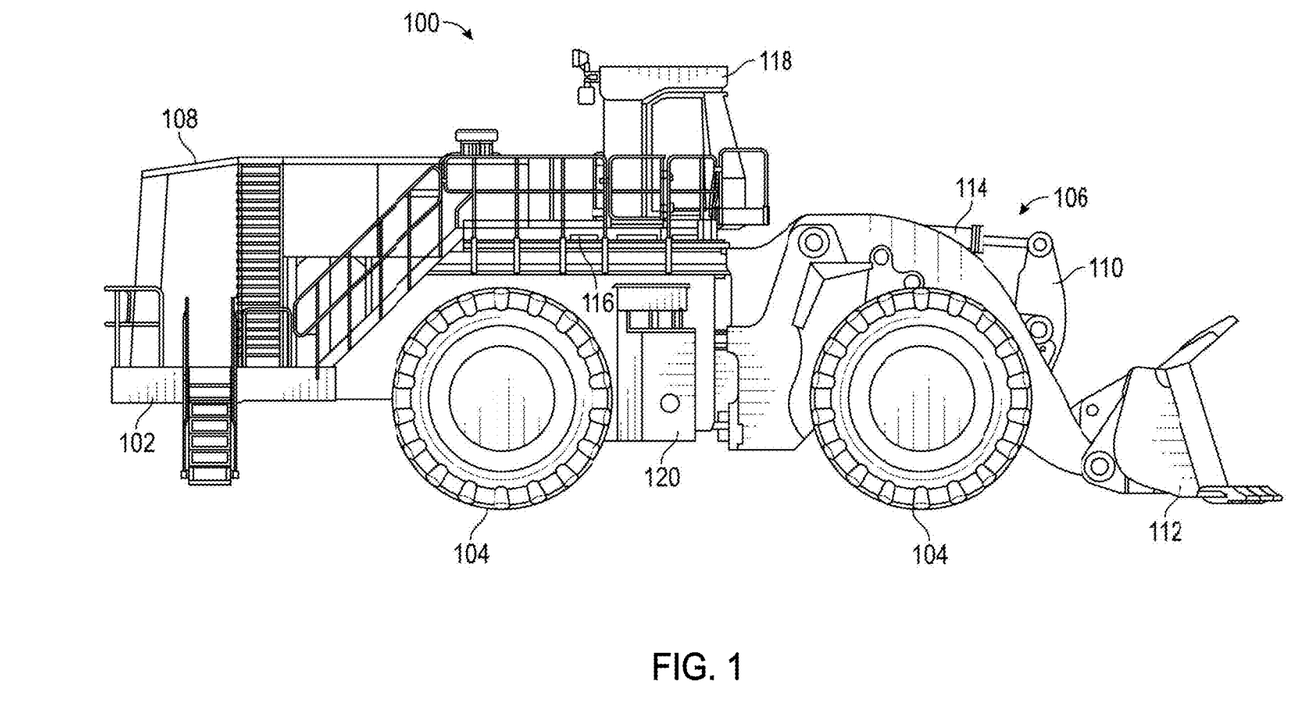
FIG. 1 is an elevation view depicting an example work machine in accordance with this disclosure.

FIG. 1 depicts an example machine 100 in accordance with this disclosure. In FIG. 1, machine 100 includes frame 102, wheels 104, implement 106, and a speed control system implemented in one or more on-board electronic devices like, for example, an electronic control unit or ECU. Example machine 100 is a wheel loader. In other examples, however, the machine may be other types of machines related to various industries, including, as examples, construction, agriculture, forestry, transportation, material handling, waste management, marine, stationary power, and so on. Accordingly, although some examples are described with reference to a wheel loader machine, examples according to this disclosure are also applicable to other types of machines including graders, scrapers, dozers, excavators, compactors, material haulers like dump trucks, marine vessels, locomotives, along with other example machine types.

Machine 100 includes frame 102 mounted on four wheels 104, although, in other examples, the machine could have more than four wheels. Frame 102 is configured to support and/or mount one or more components of machine 100. For example, machine 100 includes enclosure 108 coupled to frame 102. Enclosure 108 can house, among other components, an electric motor to propel the machine over various terrain via wheels 104. In some examples, multiple electric motors are included in multiple enclosures at multiple locations of the machine 100.

Machine 100 includes implement 106 coupled to the frame 102 through linkage assembly 110, which is configured to be actuated to articulate bucket 112 of implement 106. Bucket 112 of implement 106 may be configured to transfer material such as, soil or debris, from one location to another. Linkage assembly 110 can include one or more cylinders 114 configured to be actuated hydraulically or pneumatically, for example, to articulate bucket 112. For example, linkage assembly 110 can be actuated by cylinders 114 to raise and lower and/or rotate bucket 112 relative to frame 102 of machine 100.

Platform 116 is coupled to frame 102 and provides access to various locations on machine 100 for operational and/or maintenance purposes. Machine 100 also includes an operator cabin 118, which can be open or enclosed and may be accessed via platform 116. Operator cabin 118 may include one or more control devices (not shown) such as, a joystick, a steering wheel, pedals, levers, buttons, switches, among other examples. The control devices are configured to enable the operator to control machine 100 and/or the implement 106. Operator cabin 118 may also include an operator interface such as, a display device, a sound source, a light source, or a combination thereof.

Machine 100 can be used in a variety of industrial, construction, commercial or other applications. Machine 100 can be operated by an operator in operator cabin 118. The operator can, for example, drive machine 100 to and from various locations on a work site and can also pick up and deposit loads of material using bucket 112 of implement 106. By further way of example, both operation by a remotely located operator and autonomous or robotic operation are contemplated. Machine 100 can be used to excavate a portion of a work site by actuating cylinders 114 to articulate bucket 112 via linkage assembly 110 to dig into and remove dirt, rock, sand, etc. from a portion of the work site and deposit this load in another location. Machine 100 can include a battery compartment connected to frame 102 and including a battery system 120. Battery system 120 is electrically coupled to the one or more electric motors of the work machine 100.

Figure 2:
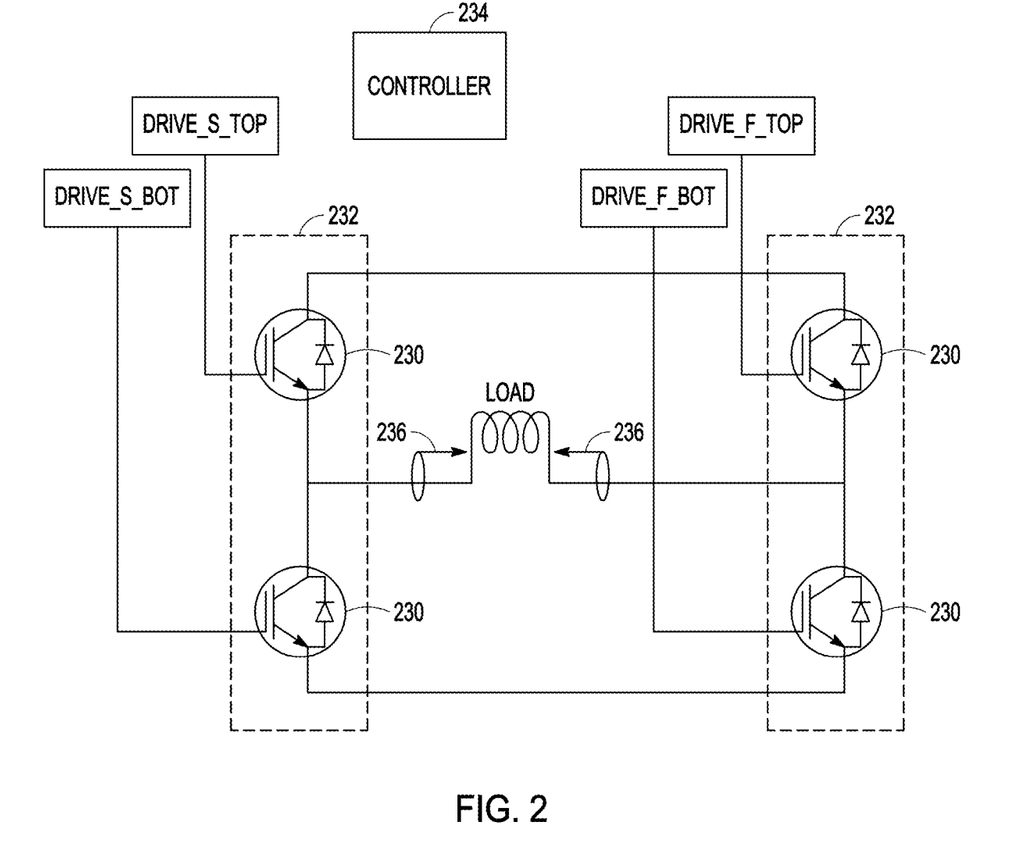
FIG. 2 is a circuit diagram of portions of an example of a dual half bridge driver in accordance with this disclosure.

FIG. 2 is a circuit diagram of the power devices of an example of a dual half bridge driver to drive a load (e.g., a phase for a motor or generator). In the example of FIG. 2, the power devices are insulated gate bipolar transistors (IGBTs) 230, and the load is connected between two half bridge circuits 232. The IGBT half bridge circuits 232 may be included in an inverter used to drive an electric motor of a work machine. A controller circuit 234 provides control signals to activate and deactivate the top and bottom IGBTs to control switching of the IGBTs 230. The IGBTs on the left in FIG. 2 may be the start side top and bottom (DRIVE_S_TOP, DRIVE_S_BOT) IGBTs, and the IGBTs on the right side may be the finish side top and bottom (DRIVE_F_TOP, DRIVE_F_BOT) IGBTs. The controller circuit 234 may include logic circuitry (e.g., processing circuitry) that includes logic to perform the functions described. The logic circuitry may include a microprocessor, application specific integrated circuit (ASIC), field programmable gate array (FPGA), or other type of processor, interpreting or executing instructions in software or firmware stored in memory. In certain examples, the controller circuit 234 includes a logic sequencer circuit. A logic sequencer refers to a state machine or other circuit that sequentially steps through a fixed series of steps to perform the functions described. A logic sequencer circuit can be implemented using hardware, firmware, or software.

The controller circuit 234 monitors the status of the dual half bridge driver. For instance, the controller circuit 234 can monitor the output of current sensors 236 to monitor for current faults. In one example, the controller circuit 234 monitors for an over-current condition, such as may result from a high-inductance short circuit at the load or in the power devices. In an application such as a work machine, operating currents may be in the hundreds of amps, and an over-current condition may involve currents in the kiloampere (kA) range. The controller circuit 234 takes corrective action when a current fault is detected.

An approach to resolving an over-current condition of a high voltage, high current application is a hard turn-off of the power devices of the driver. In a hard turn-off the control gate input is immediately deactivated to turn off the power device. However, an IGBT can turn off very quickly. If an ordinary drive signal from the controller circuit is used to turn off the IGBT, the collector-emitter voltage of the IGBT may overshoot to a high voltage, which may damage the IGBT. A better approach is to use a soft shutdown of the IGBT. In a soft shutdown, the control gates of the IGBTs are gradually deactivated. This slows down the turn off of the IGBT to reduce overshoot. A challenge to implementing a soft shutdown is that the shutdown must be fast enough to prevent damage to the circuits and other equipment of the machine yet slow enough to prevent excessive overshoot.

Figure 3:
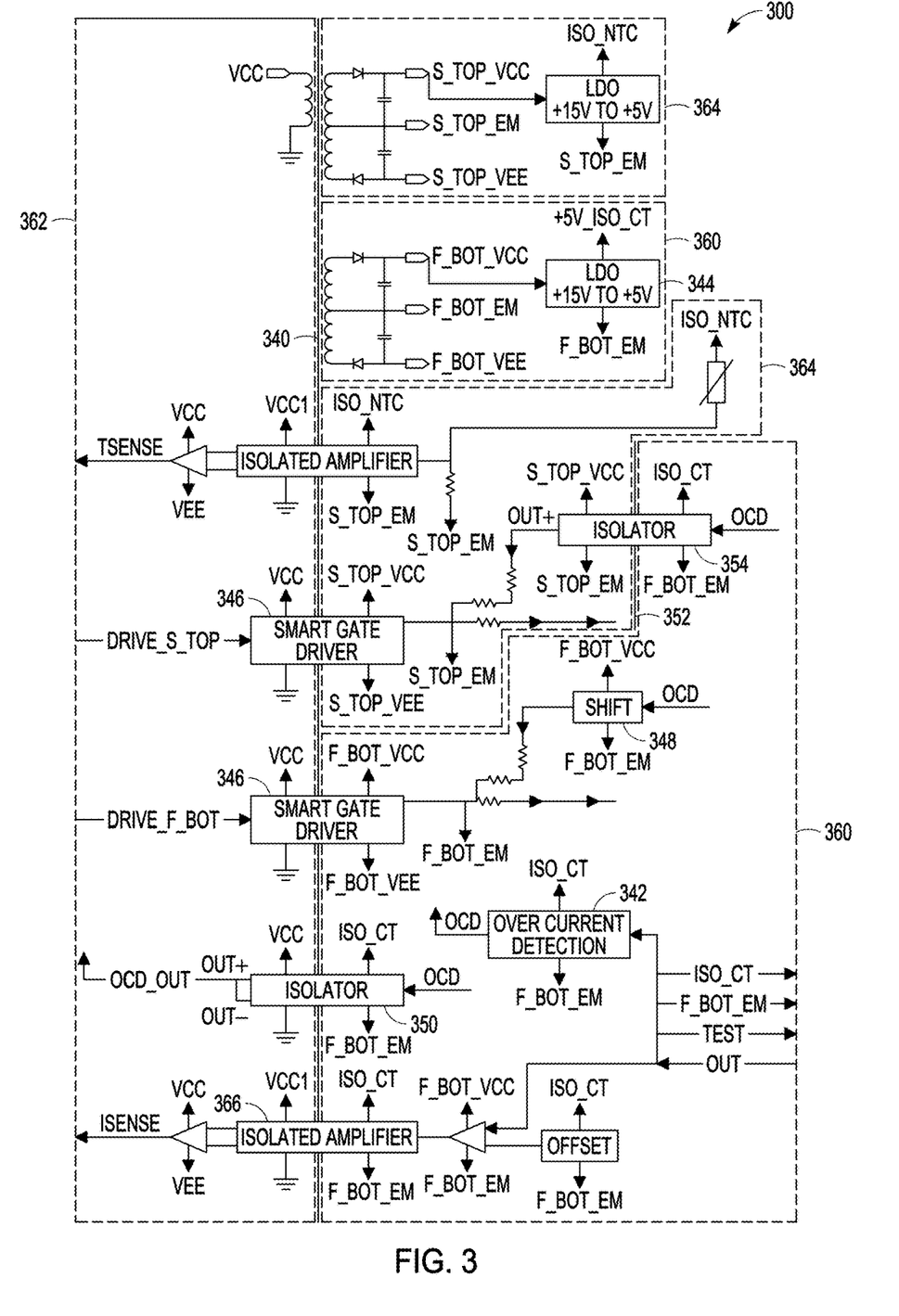
FIG. 3 is a circuit diagram of a drive circuit to drive the power devices of a dual half bridge driver in accordance with this disclosure.

FIG. 3 is a circuit diagram of a drive circuit 300 to drive the power devices of a dual half bridge driver such as the example of FIG. 2 where the power devices are IGBTs. The drive circuit 300 of FIG. 3 controls the soft shutdown in the event of a detected over-current condition. In certain examples of a soft shutdown, the drive circuit 300 may activate another device (e.g., another transistor) to gradually discharge the gates of the IGBTs 230 through a discharge-resistor to turn them off. The rate of the discharge may be set by the size of the activated device and resistance of the resistor. Another complication in turning off IGBTs is that the controller circuit 234 may operate at a lower voltage and may be isolated from the IGBTs.

The driver circuit 300 includes isolation barriers to isolate different voltage domains. A first isolation barrier 340 provides isolation between a first voltage domain 360 referenced to the emitter of the bottom IGBT on the finish side (F_BOT_EM) of the dual half bridge driver and a second voltage domain 362 that is referenced to circuit ground. The isolation barrier 340 may provide galvanic isolation between the first and second voltage domains. The bottom IGBTs in FIG. 2 are disposed in the first voltage domain 360 and the controller circuit 234 is disposed in the second voltage domain 362. A second isolation barrier 352 provides isolation between a second voltage domain referenced to the emitter of the bottom IGBT on the finish side (F_BOT_EM) of the dual half bridge driver and a third voltage domain that is referenced to the emitter of the top IGBT on the start side (S_TOP_EM) of the dual half bridge driver. The second isolation barrier 352 may provide galvanic isolation between the first and third voltage domains. The bottom IGBTs are disposed in the first voltage domain and top IGBTs are disposed in third voltage domain. The drive signal for the bottom IGBTs (DRIVE_F_BOT) and the drive signal for the top IGBTs (DRIVE_S_TOP) may come from the controller circuit 234.

In some examples, the driver circuit 300 includes smart gate driver circuits 346. The smart gate driver circuits 346 translate control signals from the voltage domain of the controller circuit 234 to the voltage domain of the power devices. The smart gate driver circuits 346 may include an optocoupler to send signal across the isolation barrier 340 while maintaining the isolation between domains. The smart gate driver circuits 346 are able to detect desaturation (DESAT) in the IGBTs. The IGBTs may come out of saturation mode into a desaturation mode as a result of a short circuit event that causes higher current to flow in the IGBTs and causes the collector emitter voltage ($V_{CE}$) to rise. The smart gate driver circuits 346 detect the desaturation voltage and report desaturation to a DESAT input of the controller circuit 234. The smart gate driver circuits 346 initiate a soft shutdown of the IGBT devices in response to detecting desaturation and avoid a hard shutdown.

The drive circuit 300 includes an over current detection (OCD) circuit 342 disposed in the first voltage domain 360 with the bottom power devices. The drive circuit 300 includes an isolated circuit supply 344 referenced to the bottom device emitter (e.g., F_BOT_EM) for the over current detection circuit 342. The isolated circuit supply 344 may include a low voltage dropout (LDO) circuit. The over current detection circuit 342 produces a fault signal (OCD) when detecting a current fault condition of the power devices and sends the fault signal as a desaturation signal to the smart driver circuits. The smart driver circuits 346 perform a soft shutdown of the power devices in response to the OCD fault signal.

The drive circuit 300 in FIG. 3 includes circuitry to report the detected over current event (e.g., from a from a high-inductance short circuit at the load) to the controller circuit 234 so that the controller circuit 234 differentiates between a desaturation event and an over current event. Current sensed from the output may also be reported to the controller circuit using an isolated amplifier 366.

To cause the over current event to initiate a soft shut down, the OCD fault signal is fed to a level shift circuit 348 which is provided to the smart driver circuit 346 to provoke desaturation detection. The level shift circuit 348 may include level shifting circuitry to shift OCD fault signal from the ISO_CT supply level (e.g., 5V) of the over current detector circuit 342 to a F_BOT_VCC supply level (e.g., 15 Volts). The F_BOT_VCC supply level may be translated (e.g., by a resistor divider circuit) to a desaturation detection voltage level of the smart driver circuit 346. The OCD fault signal may also be directly reported to the controller circuit 234 by the over current detection circuit 342. The over current detection circuit 342 feeds the OCD fault signal to an isolator circuit 350 separating the first voltage domain 360 referenced to the bottom device emitter to the second voltage domain 362 referenced to ground and the controller circuit 234. The isolator circuit 350 may include an opto-coupler or a transformer coupling for a signal to jump the isolation barrier 340 to the ground referenced voltage domain. The controller circuit 234 may track OCD fault events and take necessary actions.

The drive circuit 300 may also include a second isolation barrier 352 separating the first voltage domain 360 referenced to the bottom device emitter (F_BOT_EM) from the third voltage domain 364 refenced to a top device emitter (S_TOP_EM). The OCD fault signal is fed to a second isolator circuit 354. The isolator circuit 354 may include level shifting circuitry to shift the ISO_CT (e.g., 5V) level of the fault signal to the S_TOP_VCC supply level (e.g., 15V). The translated OCD fault signal may be fed to a smart gate driver circuit 346 to provoke desaturation detection and a soft shutdown. Again, the S_TOP_VCC level fault signal may be translated to a desaturation detection voltage level of the smart gate driver circuit 346. It should be noted that the OCD fault signal originates in the first voltage domain 360 referenced to the bottom device emitter, is fed via an isolator circuit 354 to the third voltage domain 364 referenced to the top device emitter, and is reported to the control circuit in the second voltage domain 362 referenced to circuit ground. In certain examples, the time of a soft shutdown is adjustable, and the drive circuit 300 may set a different time for a soft shutdown derived from an OCD fault signal and a soft shutdown derived from a desaturation signal.

INDUSTRIAL APPLICABILITY

Figure 4:
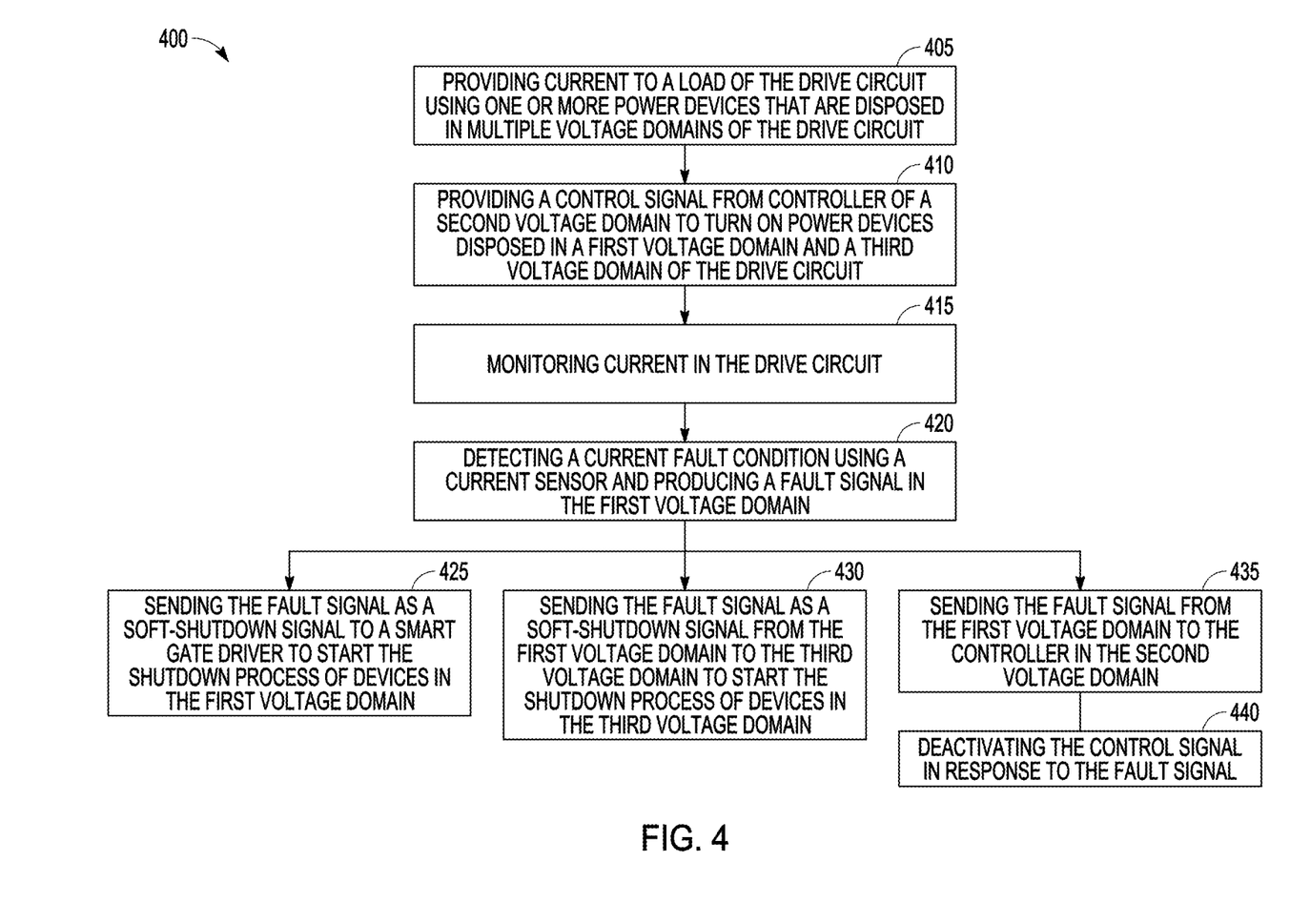
FIG. 4 is a flow diagram of an example of a method of operating a drive circuit to drive the power devices of a dual half bridge driver in accordance with this disclosure.

FIG. 4 is a flow diagram of an example of a method 400 of operating a drive circuit, such as the drive circuit 300 of FIG. 3, to drive the power devices of an inverter for an electric motor or generator of a work machine. Voltage overshoots can occur during a turn off condition of power devices such as IGBTs. The worst overshoot occurs for a fault condition resulting from a high-inductance short circuit. When such a fault event is detected, the IGBTS are turned off using a hard shutdown by immediately deactivating the IGBTs. The voltage overshoot that occurs for this type of fault constrains the system voltage to avoid excessive overshoot. The method 400 replaces the hard shutdown with a soft shutdown. The soft shutdown turns off the IGBTs more gradually than a hard shutdown, but still fast enough to protect circuitry and equipment of the work machine. The soft shutdown reduces overshoots due to high-inductance short circuits by about fifty percent (50%). The reduction of overshoot resulting from a current fault allows the system voltage to be increased. Increasing the system voltage can lead to faster charge times and reduced system losses.

At block 405, current is provided to a load of the drive circuit using one or more power devices. A controller circuit provides control signals to the power devices. In some examples, the power devices are disposed in a first voltage domain of the drive circuit and the controller circuit is disposed in a second voltage domain isolated from the first voltage domain. In some examples, the power devices are disposed in first and third voltage domains, with the third voltage domain electrically isolated from the first and second voltage domains. The first voltage domain may be referenced to a terminal of a power device such as the emitter of a bottom IGBT, the second voltage domain may be referenced to an isolated circuit ground, and the third voltage domain may be referenced to a terminal of another power device such as the emitter of a top IGBT. The second voltage domain may include a voltage lower than the first and third voltage domains.

At block 410, a control signal is provided to the power devices using the controller circuit. The control signal controls activation and deactivation of the power devices, such as to implement a switching inverter for example. The control signal is sent from the second voltage domain to the power devices in the first and third voltage domains across isolation barriers arranged between the three voltage domains.

At block 415, current in the drive circuit is monitored using a current sensor. At block 420, a current fault condition in at least one of the power devices is detected and a fault signal is produced. The fault signal is produced using a current fault detection circuit disposed in the first voltage domain.

At block 425, the fault signal is sent to a smart gate driver circuit to start the shutdown process of devices in the first voltage domain. In some examples, the fault signal from the current fault detection circuit is translated to a desaturation signal. The desaturation signal may be a threshold voltage level normally indicating that one or more power devices have changed operating mode from saturation to desaturation. The fault signal may be translated to desaturation signals for a smart gate driver circuit for the power devices in the first voltage domain. The smart gate driver circuit sees the desaturation signal as a ground-referenced signal that is an indication to perform a soft shutdown. Thus, the over current fault event that normally is a hard shutdown event that can cause excessive overshoot is masked as a soft shutdown event to the controller. The soft shutdown time may be set by devices used to discharge the control gate of the power devices.

As explained previously herein, some of the power devices may be disposed in the first voltage domain and some of the power devices may be disposed in the third voltage domain. Both the first voltage domain and the third voltage domain are referenced to a terminal of different power devices rather than circuit ground. The first voltage domain and the third voltage domain are separated by an isolation barrier.

At block 430, the fault signal from the current fault detection circuit in the first voltage domain is sent to the third voltage domain and is translated to a desaturation signal in the third voltage domain to start the soft shutdown process of the power devices in the third voltage domain. At block 435, the fault signal may be then sent to the controller circuit in the second voltage domain from the first voltage domain. It should be noted that the original fault signal from the current fault detection circuit is sent across two isolation barriers when the power devices are disposed in two voltage domains; from the first voltage domain to the second voltage domain, and from the first voltage domain to the third voltage domain. At block 440, the controller circuit deactivates the control signal in response to the fault signal.

The soft shutdown of the power devices may involve a gradual discharge the control input of the power devices that is less immediate than a hard shutdown but still fast enough to prevent current from rising above prescribed limits. Thus, the overshoot that can result from a high-inductance short circuit event is reduced by the soft shutdown.

Unless explicitly excluded, the use of the singular to describe a component, structure, or operation does not exclude the use of plural such components, structures, or operations or their equivalents. The use of the terms "a" and "an" and "the" and "at least one" or the term "one or more," and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B" or one or more of A and B") is to be construed to mean one item selected from the listed items (A or B) or any combination of two or more of the listed items (A and B; A, A and B; A, B and B), unless otherwise indicated herein or clearly contradicted by context. Similarly, as used herein, the word "or" refers to any possible permutation of a set of items. For example, the phrase "A, B, or C" refers to at least one of A, B, C, or any combination thereof, such as any of: A; B; C; A and B; A and C; B and C; A, B, and C; or multiple of any item such as A and A; B, B, and C; A, A, B, C, and C; etc.

The above detailed description is intended to be illustrative, and not restrictive. The scope of the disclosure should, therefore, be determined with references to the appended claims, along with the full scope of equivalents to which such claims are entitled.

What is claimed is:

1. A drive circuit, the drive circuit comprising:
   power devices configured to provide current to a load of the drive circuit, wherein at least a portion of the power devices are disposed in a first voltage domain of the drive circuit;
   a controller circuit configured to provide control signals to activate and deactivate the power devices, wherein the controller circuit is disposed in a second voltage domain separated from the first voltage domain by a first voltage isolation barrier;
   at least one smart gate driver circuit configured to transfer a control signal from the second voltage domain to another voltage domain and to detect a desaturation voltage of the power devices;
   an over-current detection circuit disposed in the first voltage domain and configured to produce a fault signal when sensing an overcurrent event of the power devices and send the fault signal as a soft-shutdown signal to the at least one smart gate driver circuit to provoke detection of the desaturation voltage by the at least one smart gate driver in response to sensing the over-current event; and
   wherein the at least one smart gate driver circuit is configured to perform a soft-shutdown of the power devices in response to the soft-shutdown signal.

2. The drive circuit of claim 1, wherein the over-current detection circuit is configured to produce the fault signal when detecting a high-inductance short circuit in one or more of the power devices.

3. The drive circuit of claim 1, wherein the at least one smart gate driver circuit includes an input configured to detect desaturation (DESAT input) of an insulated gate bipolar transistor (IGBT) and the fault signal is applied to the DESAT input of the at least one smart gate driver circuit as the soft-shutdown signal.

4. The drive circuit of claim 3, including a voltage level shifting circuit disposed in the first voltage domain and configured to:
   receive the fault signal from the over-current detection circuit;
   translate the fault signal to an IGBT desaturation voltage level in the first voltage domain; and
   apply the translated fault signal to the DESAT input of the at least one smart gate driver circuit.

5. The drive circuit of claim 1,
   wherein the power devices include a top IGBT and a bottom IGBT; and
   wherein the control signals are applied to gate terminals of the top IGBT and the bottom IGBT, and the at least one smart gate driver circuit is configured to deactivate the gate terminals of the top IGBT and the bottom IGBT in response to the soft-shutdown signal.

6. The drive circuit of claim 1, including:
   an isolator device disposed between the first voltage domain and a third voltage domain;
   wherein the power devices are disposed in the first voltage domain and the third voltage domain;
   wherein the at least one smart gate driver circuit includes a first smart gate driver circuit configured to transfer a control signal from the second voltage domain to the first voltage domain, and a second smart gate driver configured to transfer a control signal from the second voltage domain to the third voltage domain; and
   wherein the isolator device receives the fault signal from the over-current detection circuit in the first voltage domain and applies the fault signal to the second smart gate driver circuit in the third voltage domain.

7. The drive circuit of claim 6,
   wherein the power devices include a first top IGBT and a first bottom IGBT of an IGBT half bridge circuit, and a second top IGBT and a second bottom IGBT of the IGBT half bridge circuit; and
   wherein the first voltage domain is referenced to an emitter of the first bottom IGBT, the third voltage domain is referenced to an emitter of the second top IGBT, and the second voltage domain is referenced to circuit ground.

8. The drive circuit of claim 6, including:
   another isolator device disposed between the first voltage domain and the second voltage domain;
   wherein the controller circuit in the second voltage domain provides control signals for the power devices disposed in the first voltage domain and the third voltage domain, receives the fault signal using the isolator device disposed between the first voltage domain and the second voltage domain, and deactivates the control signals in response to the fault signal.

9. The drive circuit of claim 6,
wherein the isolator device translates the fault signal to an IGBT desaturation voltage level in the third voltage domain; and
the translated signal is applied to a desaturation detection circuit of the second smart gate driver circuit as the soft-shutdown signal.

10. A method of operating a drive circuit, the method comprising:
providing current to a load of the drive circuit using one or more power devices that are disposed in a first voltage domain of the drive circuit;
providing a control signal to the one or more power devices in the first voltage domain using a controller circuit disposed in a second voltage domain of the drive circuit, wherein the control signal traverses a first voltage isolation barrier arranged between the first and second voltage domain using a smart gate driver circuit;
detecting a current fault condition in at least one of the power devices when sensing an over-current event using a current fault detection circuit disposed in the first voltage domain and producing a fault signal;
sending the fault signal from the first voltage domain to the controller circuit disposed in the second voltage domain to indicate over-current and providing the fault signal to the smart gate driver circuit as a soft-shutdown signal to provoke desaturation voltage detection by the smart gate driver circuit in response to sensing the over-current condition; and
deactivating the one or more power devices according to a soft shutdown in response to the soft-shutdown signal.

11. The method of claim 10, wherein the detecting the current fault condition includes detecting an over-current condition due to a high-inductance short circuit in one or more of the power devices.

12. The method of claim 10,
wherein the providing current to the load includes providing current to the load using a top insulated gate bipolar transistor (IGBT) and a bottom IGBT; and
wherein the providing the fault signal to the smart gate driver circuit includes sending the fault signal to the smart gate driver circuit as a desaturation (DESAT) detection signal indicating desaturation of at least one of the top IGBT and the bottom IGBT.

13. The method of claim 12, wherein the sending the fault signal includes: translating the fault signal to an IGBT desaturation voltage level in the first voltage domain; and
applying the translated signal to a desaturation detection circuit of the smart gate driver circuit as the soft-shutdown signal.

14. The method of claim 12, wherein the providing the control signal includes the controller circuit activating a gate terminal of the top IGBT and the bottom IGBT, and the deactivating the control signal includes the control circuit deactivating the gate terminal of the top IGBT and the bottom IGBT in response to the fault signal.

15. The method of claim 10, including:
wherein the providing current to the load includes providing the current to the load using one or more power devices that are disposed in a third voltage domain and the one or more power devices of the first voltage domain; and
wherein sending the fault signal includes sending the fault signal from the current fault detection circuit disposed in the first voltage domain across a second voltage isolation barrier to the third voltage domain.

16. The method of claim 15,
wherein the providing current to the load includes providing current to the load using a first top IGBT and a first bottom IGBT of an IGBT half bridge circuit, and a second top IGBT and a second bottom IGBT of the IGBT half bridge circuit; and
wherein the first voltage domain is referenced to an emitter of the first bottom IGBT, the third voltage domain is referenced to an emitter of the second top IGBT, and the second voltage domain is referenced to circuit ground.

17. The method of claim 15, wherein the providing the control signal includes providing the control signal from the controller circuit in the second voltage domain to the one or more power devices that are disposed in the third voltage domain and deactivating the control signal sent to the one or more power devices disposed in the third voltage domain in response to the soft-shutdown signal.

18. The method of claim 15, wherein the sending the fault signal includes:
translating the fault signal to an IGBT desaturation voltage level in the third voltage domain; and
applying the translated signal to a desaturation detection circuit of a smart gate driver circuit in the third voltage domain as the soft-shutdown signal.

19. A drive system for an electric motor of a non-road electric vehicle, the system comprising:
a half bridge inverter circuit including insulated gate bipolar transistors (IGBTs) to provide current drive to the electric motor;
a smart gate driver circuit configured to provide control signals to the IGBTs including perform a soft shutdown of the IGBTs, wherein the smart gate driver circuit includes a desaturation (DESAT) input to receive a DESAT voltage indicating desaturation of at least one IGBT;
an over-current detection circuit configured to sense an over-current condition in the half bridge inverter circuit and produce a fault signal in response to the detection; and
level shifting circuitry configured to convert the fault signal to a DESAT signal to provoke a desaturation voltage detection by the smart gate driver circuit in response to the sensed over-current condition and initiate the soft shutdown of the IGBTs.

20. The drive system of claim 19, including:
a first voltage domain including a first bottom IGBT and a second bottom IGBT of the half bridge inverter circuit, wherein the first voltage domain is referenced to an emitter of the first or second bottom IGBT;
a second voltage domain including the controller circuit, wherein the second voltage domain is referenced to circuit ground; and
a third voltage domain including a first top IGBT and a second top IGBT of the half bridge inverter circuit, wherein the third voltage domain is referenced to an emitter of the first or second top IGBT.

* * * * *